(12) United States Patent
Schmitt et al.

(10) Patent No.: US 12,487,261 B2
(45) Date of Patent: Dec. 2, 2025

(54) INTERFERENCE-INSENSITIVE DETERMINATION OF A CAPACITANCE

(71) Applicant: Valeo Schalter und Sensoren GmbH, Bietigheim-Bissingen (DE)

(72) Inventors: Martin Schmitt, Bad Rodach (DE); Ciprian Musat, Creteil (FR)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 236 days.

(21) Appl. No.: 18/273,392

(22) PCT Filed: Jan. 13, 2022

(86) PCT No.: PCT/EP2022/050579
§ 371 (c)(1),
(2) Date: Jul. 20, 2023

(87) PCT Pub. No.: WO2022/157054
PCT Pub. Date: Jul. 28, 2022

(65) Prior Publication Data
US 2024/0310420 A1    Sep. 19, 2024

(30) Foreign Application Priority Data
Jan. 20, 2021  (DE) ............... 10 2021 101 132.9

(51) Int. Cl.
*G01R 27/26*  (2006.01)
*H03K 17/96*  (2006.01)

(52) U.S. Cl.
CPC ....... *G01R 27/2605* (2013.01); *H03K 17/962* (2013.01); *H03K 2217/960725* (2013.01)

(58) Field of Classification Search
CPC .. H03K 17/955; H03K 17/962; H03K 17/975; H03K 2217/9607;

(Continued)

(56) References Cited

U.S. PATENT DOCUMENTS 6,466,036 B1 *  10/2002  Philipp ................ G01D 5/24
                                              324/678
2010/0283485 A1  11/2010  Valisuo et al.
2019/0113554 A1 *  4/2019  Sieg ................ G01R 27/2605

FOREIGN PATENT DOCUMENTS

DE   102018107478 A1   3/2019
EP       2680018 A1   1/2014
EP       3474452 A1   4/2019

OTHER PUBLICATIONS

International Search Report and Written Opinion in corresponding International Publication No. PCT/EP2022/050579, dated Apr. 20, 2022 (11 pages).

(Continued)

*Primary Examiner* — Lee E Rodak
*Assistant Examiner* — Jeremiah J Barron
(74) *Attorney, Agent, or Firm* — Osha Bergman Watanabe & Burton LLP (57) ABSTRACT

According to a method for determining the capacitance of a capacitive element (3), during each measurement cycle of a plurality of successive measurement cycles, the capacitive element (3) is charged, and then a charge quantity is transferred to a further capacitive element (5). After the plurality of measurement cycles, a measurement value relating to the total charge quantity transferred is determined, and the capacitance of the capacitive element (3) is determined as a function of the measurement value. A first duration is defined for a first subset of the plurality of measurement cycles, and a different second duration is defined for a second subset of the plurality of measurement cycles.

14 Claims, 2 Drawing Sheets

(58) Field of Classification Search
CPC ........ H03K 2217/96072; H03K 2217/960755;
H03K 2217/960705; H03K 2217/960725;
H03K 2217/96078; H03K 2217/96074;
H03K 2217/960745; H03K 2217/94073;
G06F 3/044
See application file for complete search history.

(56) References Cited

OTHER PUBLICATIONS

German Search Report in corresponding German Application No. 10 2021 101 132.9, dated Nov. 24, 2021 (11 pages).

\* cited by examiner

INTERFERENCE-INSENSITIVE DETERMINATION OF A CAPACITANCE

The present invention relates to a method for determining a capacitance of a capacitive element, wherein, during each measurement cycle of a plurality of successive measurement cycles, the capacitive element is charged and an amount of charge is subsequently transferred from the capacitive element to a further capacitive element and, following the plurality of measurement cycles, a measured value relating to a total amount of charge transferred as a whole to the further capacitive element during the plurality of measurement cycles is determined, and the capacitance of the capacitive element is determined depending on the measured value. The invention also relates to a corresponding measuring arrangement for determining a capacitance, a user input device having a capacitive element, and a computer program product.

In document U.S. Pat. No. 6,466,036 B1, a pulse circuit for measuring the capacitance of a sensor plate is specified that is capable of repeatedly transferring charge accumulated at the sensor plate to a capacitor and, following a plurality of repetitions, to read out the transferred amount of charge or to read out a corresponding voltage in order to determine the capacitance of the sensor plate.

By way of example, such circuits can be used to capacitively recognize user inputs, wherein the user approaching or touching the sensor plate changes the capacitance of the sensor plate and the the touching or approaching can be detected as a result. In particular, such touch recognition can be used for applications in the interior of motor vehicles, for example in the case of recognizing the actuation of touch-sensitive operating panels or operating elements.

Since the individual charge transfers from the sensor plate to the further capacitor take place repeatedly at a previously defined frequency, the corresponding circuits and measuring methods can be influenced by external interfering influences with similar frequencies. As a result, accuracy and reliability of the determination of the capacitance, and accordingly the reliability of the touch recognition can be reduced.

Certain frequency ranges can be countered using analog low-pass filters or digital filters. In the case of typical sampling frequencies of the order of magnitude of 10 µs and a corresponding Shannon or Nyquist frequency of the order of magnitude of 50 kHz, by way of example, interference above the Shannon frequency and below a limit for the low-pass filtering of the order of magnitude of one or more MHz are not taken into account.

Against this background, one object of the present invention is to specify an improved concept for determining a capacitance of a capacitive element, by way of which the influence of external interference, in particular in the form of electromagnetic waves, can be reduced.

This object is achieved by the respective subject matter of the independent claims. Advantageous refinements and preferred embodiments are the subject matter of the dependent claims.

The improved concept relates to the idea of changing the sampling frequency or a corresponding period of a plurality of successive measurement cycles.

According to the improved concept, a method for determining a capacitance of a capacitive element is specified. In this case, the capacitive element is charged, in particular partially charged, during each measurement cycle of a plurality of successive measurement cycles, and an amount of charge is subsequently transferred from the capacitive element to a further capacitive element within the same measurement cycle. Following the plurality of measurement cycles, that is to say in particular following the end of all the measurement cycles of the plurality of measurement cycles, a measured value relating to a total amount of charge transferred as a whole to the further capacitive element during the plurality of measurement cycles is determined, in particular by means of a computing unit. The capacitance of the capacitive element is determined depending on the measured value, in particular by means of the computing unit. In this case, the plurality of measurement cycles contains a first subset of measurement cycles and a second subset of measurement cycles. A first period is defined for the first subset by means of the computing unit and a second period is defined for the second subset by means of the computing unit, said second period differing from the first period.

The period of a measurement cycle in this case corresponds to the time that elapses from the start until the end of the entire respective measurement cycle. The period of a measurement cycle can therefore be understood as inverse sampling frequency. The first and second periods are therefore defined, in particular by means of the computing unit, before or when the respective measurement cycle begins.

In other words, each measurement cycle of the first subset has the first period and each measurement cycle of the second subset has the second period.

In particular, the measurement cycles of the first period do not all follow one another. Accordingly, the measurement cycles of the second subset do not all follow one another either. By way of example, after each measurement cycle of the first subset, a measurement cycle of the second subset can initially follow, before a further measurement cycle of the first subset follows again, and so on. Besides the first and second subsets, the plurality of measurement cycles can also include one or more further subsets, each in turn having various further periods. In the course of the plurality of measurement cycles, measurement cycles having different periods, that is to say measurement cycles from different subsets, can alternate, such that the respective periods of two successive measurement cycles of the plurality of measurement cycles always differ from one another.

By way of example, a voltage present at the further capacitive element or the voltage dropped across the further capacitive element can be measured in order to determine the measured value. The measured value thus corresponds in particular to a voltage value or depends on a corresponding voltage value of the further capacitive element. The voltage measurement for determining the measured value takes place in particular only when the plurality of measurement cycles have ended.

The amount of charge transferred from the capacitive element to the further capacitive element during a measurement cycle does not necessarily correspond exactly to the amount of charge that was charged to the capacitive element upon the capacitive element being charged during the same measurement cycle. By way of example, a charge equalization between the capacitive element and the further capacitive element can be prevented during charging of the capacitive element, and the charge equalization between the capacitive element and the further capacitive element can be permitted in order to transfer the amount of charge.

While the charge accumulates in the course of the plurality of successive measurement cycles at the further capacitive element to form the total amount of charge, the capacitive element can, for example, be discharged, that is to say reset, after each individual measurement cycle or within each individual measurement cycle.

A measurement cycle can therefore include a plurality of successive sections that correspond to different states of the capacitive element and of the further capacitive element or of a circuit having the capacitive element and the further capacitive element. By way of example, the capacitive element can be in the form of a capacitor or can include a single sensor surface, wherein the capacitance of the capacitive element can then, for example, be provided by the inherent capacitance of the sensor surface, for example with respect to a ground potential.

The further capacitive element can likewise be in the form of a capacitor. In this case, the dimensioning of the further capacitive element is chosen, in particular, in such a way that a capacitance of the further capacitive element is several times greater than a maximum capacitance of the capacitive element, for example greater by a factor of the order of magnitude of 10 to 1000, in particular of the order of magnitude of 100 to 1000.

By virtue of the capacitance of the capacitive element therefore being determined indirectly via the total amount of charge transferred to the further capacitive element, the accuracy in the capacitance determination can be increased significantly, since the very many low voltages that are present at the capacitive element itself do not have to be measured and evaluated.

Owing to the fact that the respective measurement cycles of the first and second subsets have periods that are different from one another, and the sampling frequency therefore changes during the multiplicity of measurement cycles, the influence due to external interference, which corresponds to electromagnetic waves with approximately single-frequency spectral characteristics, is reduced. In particular, although such external interference can influence individual measurement cycles of the plurality of measurement cycles, in general it will not influence all of the measurement cycles, however, since these have appropriately detuned periods or sampling frequencies. By way of example, if the external interference influences the first subset of measurement cycles because a dominant frequency of the external interference corresponds approximately to the inverse of the first period, it does not influence the measurement cycles of the second subset, and vice versa.

According to at least one embodiment of the method according to the improved concept, each of the measurement cycles contains a charging section, wherein the capacitive element is charged during the charging section, in particular exclusively during the charging section. Each of the measurement cycles furthermore has a transfer section, wherein the amount of charge is transferred from the capacitive element to the further capacitive element during the transfer section, in particular exclusively during the transfer section.

In this case, the transfer section is downstream of the charging section of the same measurement cycle, but does not necessarily follow it directly. In particular, each measurement cycle of the plurality of measurement cycles includes successive sections that include the charging section and the transfer section. By way of example, the difference between the first period and the second period can be implemented in a single one of the sections or distributed over a plurality of sections.

According to at least one embodiment, a first charging duration is defined for the respective charging section of the measurement cycles of the first subset in order to define the first period and a second period is defined for the respective charging section of the measurement cycles of the second subset in order to define the second period, wherein the second charging duration differs from the first charging duration.

In particular, the first charging duration is the same for all the charging sections of the measurement cycles of the subset, and analogously, the second charging duration is the same for all the charging sections of the measurement cycles of the second subset.

According to at least one embodiment, a first transfer duration is defined for the respective transfer section of the measurement cycles of the first subset in order to define the first period and a second transfer duration is defined for the respective transfer section of the measurement cycles of the second subset in order to define the second period, wherein the second transfer duration differs from the first transfer duration.

In particular, in order to define the first and the second period, only the corresponding first and second transfer durations can be defined differently from one another, whereas the charging duration is the same for all the charging sections of the measurement cycles of the plurality of measurement cycles, that is to say in particular of the first and the second subset.

In principle, the period of any sections of the measurement cycle can be changed. Depending on the embodiment of the corresponding circuit, it can be advantageous to change the transfer durations of the transfer sections in order to avoid leakage currents in the evaluation electronics.

According to at least one embodiment, each of the measurement cycles has an intermediate section between the charging section and the first transfer section, wherein the capacitive element is neither charged nor discharged during the intermediate section.

According to at least one embodiment, each of the measurement cycles has a further intermediate section upstream of the charging section or downstream of the transfer section, wherein the capacitive element is neither charged nor discharged during the further intermediate section.

By way of example, each measurement cycle can include, or consist of, the charging section, the intermediate section, the transfer section and the further intermediate section, in this order. Alternatively, each of the measurement cycles can include, or consist of, the further intermediate section, the charging section, the intermediate section and the transfer section, in this order.

As explained above, as a result of appropriate connection of the capacitive element and of the further capacitive element, a charge equalization between the capacitive element and the further capacitive element can be prevented during the charging section and permitted during the transfer section. The intermediate sections make it possible to avoid a situation where, during the changeover from the charging section to the transfer section, or vice versa, leakage currents starting from the further capacitive element falsify the measurement.

According to at least one embodiment, a first intermediate duration is defined for the respective intermediate section of the measurement cycles of the first subset in order to define the first period and a second intermediate duration is defined for the respective intermediate section of the measurement cycles of the second subset in order to define the second period, wherein the second intermediate duration differs from the first intermediate duration.

According to at least one embodiment, a first further intermediate duration is defined for the respective further intermediate section of the measurement cycles of the first subset in order to define the first period and a second further intermediate duration is defined for the respective further intermediate section of the measurement cycles of the second subset in order to define the second period, wherein the second further intermediate duration differs from the first further intermediate duration.

According to at least one embodiment, by means of the computing unit, a counter reading of a counter is set for each measurement cycle of the plurality of measurement cycles, and a period is defined for the respective measurement cycle depending on the respective set counter reading.

The periods, which are defined in this way, for the measurement cycles of the plurality of measurement cycles in particular include the first period for the first subset of measurement cycles and the second period for the second subset of measurement cycles.

In particular, there is a clear assignment of the respective set counter reading to a corresponding period. In other words, the counter can assume a predefined finite amount of counter readings, wherein each of the counter readings corresponds to exactly one period. Therefore, for example, the first period corresponds to a first counter reading, and the second period corresponds to a second counter reading that is different from the first counter reading.

In this case, the counter can in particular be implemented as hardware or as software. By way of example, the counter can be in the form of a binary counter, such that the counter can encode a number of n bits, wherein $n \geq 1$, preferably $n \geq 2$, for example, $n=3$, $n=4$ or $n=5$. Accordingly, the number of counter readings, and therefore the number of encodable periods for the measurement cycles, is equal to $2^n$.

In principle, the number of measurement cycles of the plurality of measurement cycles can be greater or less than $2^n$, but is preferably greater than $2^n$. For $n=3$, $n=4$, $n=5$ or $n=6$, this would correspondingly result in $2^n=8$, $2^n=16$, $2^n=32$ or $2^n=64$. The number of measurement cycles of the plurality of measurement cycles is preferably greater than or equal to 100, for example greater than or equal to 200, greater than or equal to 300, greater than or equal to 400, or greater than or equal to 500. By way of example, the number of measurement cycles of the plurality of measurement cycles is in the range between 100 and 1000.

In embodiments in which the number of measurement cycles is greater than 2n, the counter therefore in particular runs through all of its possible counter readings several times. Accordingly, in such embodiments, at least two measurement cycles of the plurality of measurement cycles have the same period. However, this is not necessarily the case.

If, from an application-specific point of view, larger counters are possible, i.e. in particular greater values for n, $2^n$ can also be greater than or equal to the number of measurement cycles, for example for a number of measurement cycles equal to 300 and $n \geq 9$.

Using the counter in the manner described makes it possible to achieve a particularly simple variation of the periods of the measurement cycles.

By way of example, starting from an initial counter reading for each of the measurement cycles of the plurality of measurement cycles, the counter reading can be increased by a predefined increment, for example by 1, for as long as the counter reading is lower than or equal to a predefined maximum counter reading. The counter reading can be reset to the initial counter reading if the counter reading has reached the maximum counter reading.

By way of example, the initial counter reading can be equal to 0 and the maximum counter reading equal to $2^{n-1}$, wherein the increment is equal to 1. In this case, the counter reading can be correspondingly changed at the beginning, during, or shortly before each of the measurement cycles.

According to at least one embodiment, the relationship $N \leq M$ applies, wherein M designates the number of measurement cycles of the plurality of measurement cycles, $(N-1)*I$ is an integer that designates a difference between the maximum counter reading and the initial counter reading, and I designates the increment.

According to at least one embodiment, by means of the computing unit, for each measurement cycle of the plurality of measurement cycles, the respective period is defined as the sum of a predefined minimum period that is constant for all of the measurement cycles of the plurality of measurement cycles and an additional period that is dependent on the respective set counter reading.

In this case, the additional period is in particular directly proportional to the counter reading. In this case, the maximum counter reading therefore in particular corresponds to a maximum additional period.

In this case, the maximum additional period can in particular be shorter than the minimum period. For example, the maximum additional period is shorter than or equal to 10% of the minimum period, for example shorter than or equal to 5% of the minimum period or shorter than or equal to 1% of the minimum period. The minimum period can, for example, be between 0.5% and 5% or between 0.5% and 2% of the minimum period. It has been found that such variations of the period are well suited to sufficiently reducing influences of external interference.

According to at least one embodiment, the minimum period is in a range between 0.5 µs and 30 µs, in particular in a range between 1 µs and 20 µs.

According to at least one embodiment, the respective additional period is shorter than or equal to a tenth of the minimum period, in particular shorter than or equal to a fiftieth of the minimum period, for example shorter than or equal to a hundredth of the minimum period.

According to the improved concept, a method for detecting a user input is also specified, wherein the user input includes the user touching a capacitive element. The method for detecting the user input according to the improved concept includes carrying out a method for determining a capacitance of the capacitive element according to the improved concept. The capacitance, determined in this way, of the capacitive element is compared with a predefined threshold value by means of the computing unit, and the user input or the touching is detected by means of the computing unit depending on a result of the comparison.

According to the improved concept, a measuring arrangement for determining a capacitance of a capacitive element is specified. The measuring arrangement has a connection to connect the capacitive element to the measuring arrangement, and a circuit. The circuit is configured, during each measurement cycle of a plurality of successive measurement cycles, to connect the capacitive element to a voltage source in order to charge the capacitive element, and to subsequently transfer an amount of charge from the capacitive element to a further capacitive element of the measuring arrangement. The measuring arrangement has a computing unit that is configured, following the plurality of measurement cycles, to determine a measured value relating to a total amount of charge transferred as a whole to the further capacitive element during the plurality of measurement cycles and to determine the capacitance of the capacitive element depending on the measured values. The computing unit is configured to define a first period for a first subset of the plurality of measurement cycles and to define a second period for a second subset of the plurality of measurement cycles, said second period differing from the first period.

In general, the capacitive element is not necessarily part of the measuring arrangement. In various embodiments, the measuring arrangement, in particular the circuit, can include the capacitive element, however. By way of example, the further capacitive element can likewise be part of the circuit.

Equally, in general, the voltage source is not necessarily part of the measuring arrangement. In various embodiments, however, the measuring arrangement can also include the voltage source.

In order to connect the capacitive element to the voltage source, or in order to transfer the amount of charge from the capacitive element to the further capacitive element, the circuit can have appropriate switching elements and a controller to control the switching elements, for example. In various configurations, the controller can also be part of the computing unit.

In particular, the computing unit can include a microcontroller.

According to at least one embodiment, the computing unit includes an analog-to-digital converter, ADC, that is able to be connected to the further capacitive element in order to determine the measured value.

Further embodiments of the measuring arrangement according to the improved concept follow directly from the various configurations of the method for determining a capacitance according to the improved concept and of the method for detecting a user input according to the improved concept, and vice versa in each case. In particular, a measuring arrangement according to the improved concept can be configured to carry out a method according to the improved concept, or carries out such a method.

According to the improved concept, a user input device, also referred to as a user input interface, is also specified, in particular a user input device for use in a motor vehicle interior. The user input device has a capacitive element that is arranged so as to be touched by a user. The user input device contains a measuring arrangement for determining a capacitance of the capacitive element according to the improved concept.

According to the improved concept, a computer program product having instructions is also specified. When the instructions are executed by a computing unit of a measuring arrangement according to the improved concept, the instructions cause the measuring arrangement to carry out a method according to the improved concept.

By way of example, the computer program product can be in the form of a computer program having the instructions. The computer program product can also be in the form of a computer-readable storage medium having a computer program that includes the instructions.

Further features of the invention are evident from the claims, the figures, and the description of the figures. The features and combinations of features mentioned above in the description and the features and combinations of features mentioned below in the description of the figures and/or shown in the figures alone can be included in the improved concept not only in the combination specified in each case, but also in other combinations. Thus, those embodiments of the improved concept that are not explicitly shown and/or explained in the figures, but emerge and can be produced from the explained embodiments by virtue of separate combinations of features, are also included and disclosed. Therefore, in particular, embodiments and combinations of features that do not have all the features of an originally worded claim are also included and disclosed. Furthermore, embodiments and combinations of features that go beyond or differ from the combinations of features set out in the back-references of the claims are included and disclosed.

Figure 1A:
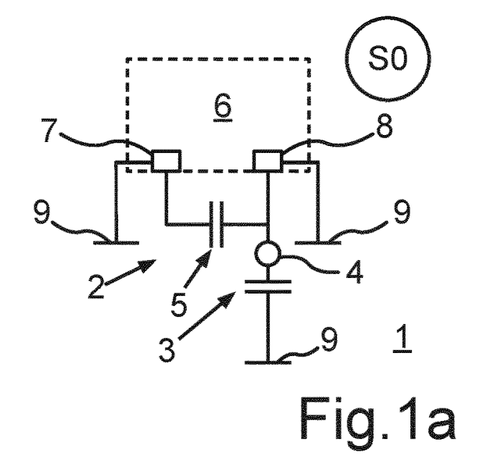
FIG. 1a shows a schematic illustration of an exemplary embodiment of a measuring arrangement according to the improved concept in an initialization state.
Figure 1B:
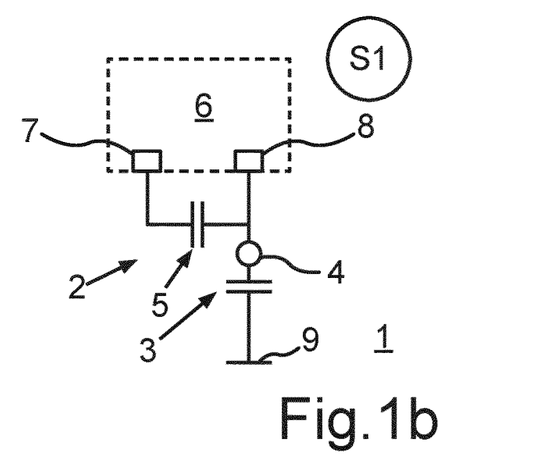
FIG. 1b shows a schematic illustration of the measuring arrangement from FIG. 1a in an intermediate state.
Figure 1C:
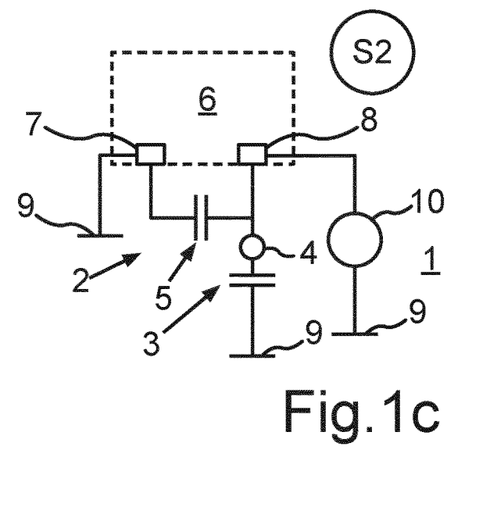
FIG. 1c shows a schematic illustration of the measuring arrangement from FIG. 1c and FIG. 1c in a charging state.
Figure 1D:
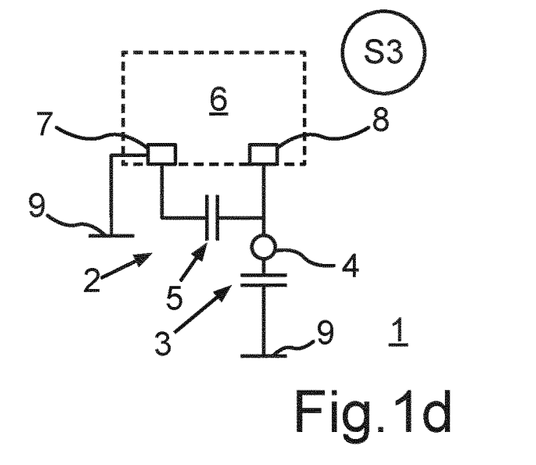
FIG. 1d shows a schematic illustration of the measuring arrangement from FIGS. 1a to 1c in a transfer state.
Figure 1E:
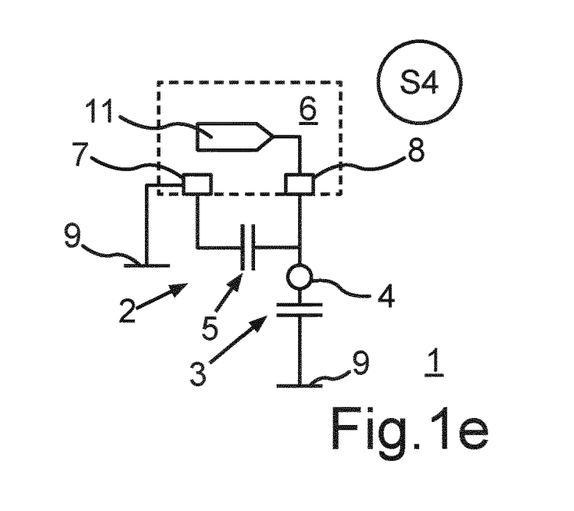
FIG. 1e shows a schematic illustration of the measuring arrangement from FIG. 1a to FIG. 1d in a read-out state.
Figure 2:
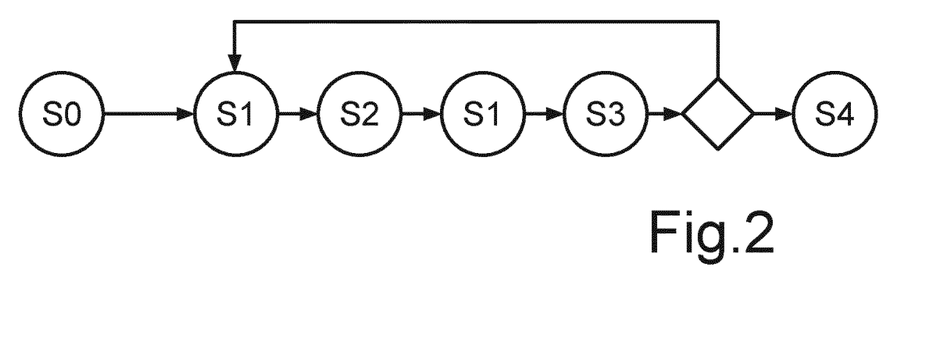
FIG. 2 shows a flow chart of an exemplary embodiment of a method according to the improved concept.

FIG. 1a to FIG. 1e show an exemplary embodiment of a measuring arrangement 2, according to the improved concept, which, for example, is part of a user input device 1, for example for use in the interior of a motor vehicle (not shown). FIG. 1a to FIG. 1e in this case represent different states of the measuring arrangement 2 according to different sections of measurement cycles in a method according to the improved concept. An associated flow chart of a method for detecting a user input according to the improved concept is shown in FIG. 2.

The user input device 1 has a capacitive element 3 that is arranged and configured so as to be touched by a user. By way of example, the capacitive element 3 can be in the form of a touch-sensitive film or touch-sensitive sensor plate. The user can, for example, touch a surface of the capacitive element 3 or approach it using a finger in order to activate a user input. The user approaching or touching the capacitive element 3 changes the capacitance of said element. The measuring arrangement 2 is capable of determining the capacitance of the capacitive element 3 and of deducing the presence of the user input on the basis thereof.

The measured capacitance of the capacitive element 3 can therefore be understood to be inherent capacitance with respect to a ground potential. Therefore, in FIG. 1a to FIG. 1e, the capacitive element 3 is likewise shown as a capacitor, the first connection of which is connected to a reference potential connection 9, in particular a ground connection.

The measuring arrangement 2 has a connection 4 in order to connect the capacitive element 3, in particular the first connection of the capacitive element 3, to the measuring arrangement 2, and a further capacitive element 5 that can be in the form of a capacitor, for example.

A second connection of the capacitive element 3 is connected to a first connection of the further capacitive element 5. In this case, the second connection of the capacitive element 3 is in particular directly connected to, or is formed by, the sensor plate or the touch-sensitive film or the like. A second connection of the further capacitive element 5 is connected to a first connection 7 of a computing unit 6 of the measuring arrangement 2. A second connection 8 of the computing unit 6 is connected to the second connection of the capacitive element and to the first connection of the further capacitive element 5. By way of example, the computing unit 6 can include a microcontroller or another integrated circuit.

The measuring arrangement 2 also has a circuit that is not shown separately in FIG. 1a to FIG. 1e. The circuit includes a controller and a plurality of switching elements that can be actuated by the controller. The controller can also be part of the computing unit 6. The switching elements are arranged and configured, actuated by the controller, to connect the connections 7 and 8 of the computing unit 6 to, or to disconnect them from, the reference potential connection 9, depending on the present state of the measuring arrangement 2. Using the switching elements, the controller can furthermore connect a voltage source 10, which, for example, can be part of the measuring arrangement 2 or of the user input device 1, or can be provided externally thereto, to the second connection 8 of the computing unit 6, or can disconnect the connection, depending on the state of the measuring arrangement 2.

The computing unit 6 furthermore has an analog-to-digital converter, ADC, 11 that is able to be connected to the second connection 8. In particular, the circuit can connect the ADC 11 to, or disconnect it from, the second connection 8, depending on the state of the measuring arrangement 2.

When carrying out a method according to the improved concept, various states S0, S1, S2, S3, S4 of the measuring arrangement 2, as are shown in FIG. 1*a* to FIG. 1*e*, are run through partly cyclically or repeatedly, as is shown by way of example in FIG. 2. In this case, S0 designates an initialization state of the measuring arrangement 2 during an initialization section of the method and S4 designates a read-out state of the measuring arrangement 2 during a read-out section of the method.

States S1 to S3 form a measurement cycle, wherein a plurality of successive measurement cycles are carried out in order to carry out the method. As revealed by FIG. 2, in order to determine the capacitance of the capacitive element 3, or in order to detect the user input, the measuring arrangement 2 is initially put into the initialization state S0, then the plurality of measurement cycles are carried out, and then the measuring arrangement 2 is in turn put into the read-out state S4. The sequence outlined in FIG. 2 can also be referred to as a measurement operation, wherein the measurement operation can likewise be carried out repeatedly during operation of the measuring arrangement 2 or of the user input device 1 in order to continuously monitor the capacitive element 3 in respect of a touch by the user.

In one embodiment of the method, as is shown in FIG. 2, each measurement cycle includes an intermediate section, a subsequent charging section, a subsequent further intermediate section and a subsequent transfer section. Accordingly, during a measurement cycle, the measuring arrangement 2 is changed from an intermediate state designated by S1 to a charging state designated by S2, which is then followed by the intermediate state S1 again, followed by a transfer state designated by S3. Following the end of the measurement cycle, a check is performed by means of the computing unit 6 to determine whether the predefined number of measurement cycles per measurement operation has been achieved. If this is the case, the measuring arrangement 2 is put into the read-out state S4, otherwise the next measurement cycle follows.

In the state S0, the controller connects the first connection 7 and the second connection 8 in each case to the reference potential connection 9 by means of the circuit. The first and second connections of the capacitive element 3 and of the further capacitive element 5 are therefore each connected to the reference potential connection 9. Accordingly, both the capacitive element 3 and the further capacitive element 5 are discharged during the initialization state S0. In the subsequent first intermediate section, the measuring arrangement 2 is put into the intermediate state S1, which can also be referred to as switching state or changeover state. In this case, the connections 7 and 8 of the computing unit 6 are disconnected from the reference potential connection 9. The measuring arrangement 2 remains in the intermediate state S1 during the intermediate section for an intermediate duration that is, for example, shorter than 1 µs, for example is between 0.1 µs and 1 µs.

The controller then changes the measuring arrangement 2 to the charging state S2 by means of the circuit. In comparison with the intermediate state S1, in this case the second connection 8 of the computing unit 6 is connected to the voltage source 10 in order to therefore charge the capacitive element 3. By virtue of, for example, the first connection 7 being set internally to a high impedance, the amount of charge at the further capacitive element 5 does not change. The charging state S2 is maintained for a predefined charging duration, which, for example, can be in the range of from 1 µs to 10 µs. The measuring arrangement 2 is then put into the intermediate state S1 again during a further intermediate section. A further intermediate duration of the further intermediate section can, for example, be equal to the intermediate duration of the intermediate section.

During a subsequent transfer section, the measuring arrangement 2 is put into the transfer state S3 by the controller of the circuit. In this case, the second connection 8 of the computing unit 6 is now set to a high impedance, and the first connection 7 is connected to the reference potential connection 9. A charge equalization between the capacitive element 3 and the further capacitive element 5 can take place as a result. The capacitance of the further capacitive element 5 is chosen to be several times greater than the maximum capacitance of the further capacitive element 3, such that an amount of charge determined by the two capacitances is effectively transferred from the capacitive element 3 to the further capacitive element 5.

A transfer duration of the transfer section can, for example, be in a range of from 0.5 µs to 5 µs or in a range of from 0.5 µs to 2 µs, or the like. A read-out duration of the read-out time period can, for example, be in a range of from 0.5 µs to 5 µs or in a range of from 0.5 us to 2 µs.

The states S1, S2, S1, S3 are repeated cyclically in this order, as indicated in FIG. 2, until a predefined total number of measurement cycles have been run through, for example 300 to 500 measurement cycles. Following the total number of measurement cycles, a total amount of charge was transferred as a whole from the capacitive element 3 to the further capacitive element 5 in the respective transfer sections. This total amount of charge is then read out in the subsequent read-out section by means of the computing unit 6. To this end, the measuring arrangement 2 is put into the read-out state S4 by means of the controller and the circuit. For this purpose, the first connection 7 of the computing unit 6 remains connected to the reference potential connection 9 and the second connection 8 of the computing unit 6 is connected to the ADC 11 in order to measure the voltage between the connection 4 of the measuring arrangement 2 and the reference potential connection 9 and to therefore determine a measured value that reflects the total amount of charge.

Following the read-out section, the computing unit 6 can compare the measured value determined in this way with a predefined threshold value in order to identify whether the user has or has not touched the capacitive element 3. If the measured value is greater than the predefined limit value or threshold value, touching can be assumed, for example.

According to the improved concept, the total periods of the individual measurement cycles of the plurality of measurement cycles are not constant. This is outlined schematically in FIG. 3 for an exemplary embodiment. In the embodiment according to FIG. 3, the intermediate durations of the intermediate section and of the further intermediate section and the charging duration of the charging section are each constant. The transfer duration of the transfer section is composed of a predefined constant, that is to say constant in particular for all the measurement cycles, minimum transfer duration and an additional period dT that is different for different measurement cycles. The sum of the minimum transfer duration, the charging duration and the respective intermediate durations of the intermediate sections corresponds to a minimum period Ts for the measurement cycles. In other words, the period of a measurement cycle is provided by the sum of the minimum period Ts and the additional period dT. In this case, the additional period dT can be systematically varied in particular between 0 and a maximum additional period.

Figure 3:
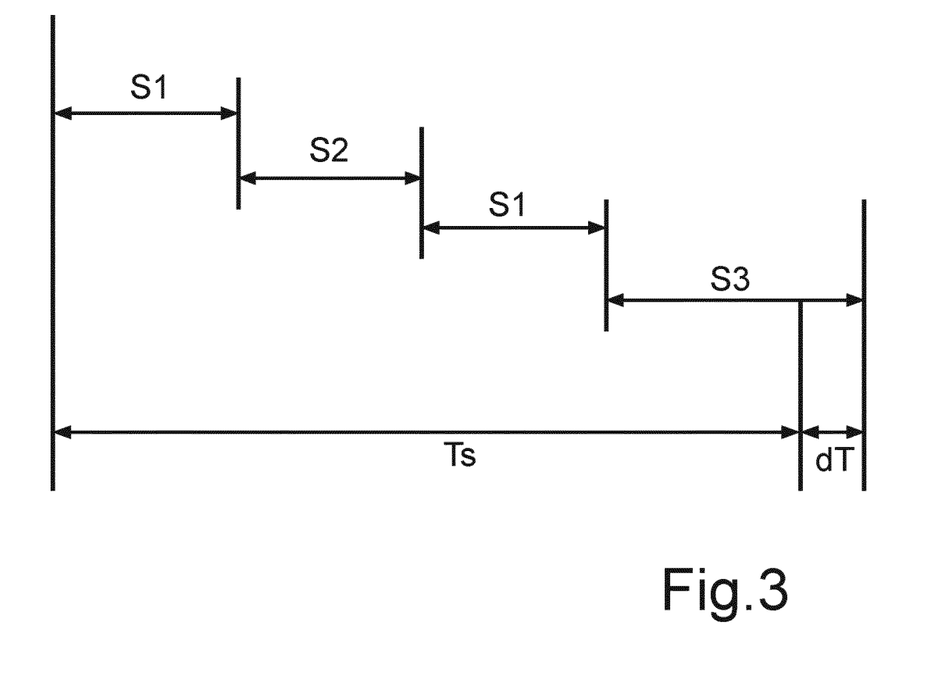
FIG. 3 shows a schematic illustration of a measurement cycle in a method according to the improved concept.

It is pointed out that it is not necessarily the case that the transfer duration of the transfer section has to be changed, or it is not necessarily the case that only the transfer duration has to be changed, in order to vary the period of the measurement cycle. In other embodiments, the respective periods of one or more of the further sections can also be varied.

By way of example, the computing unit 6 can set a counter reading for each measurement cycle of the plurality of measurement cycles, such that the counter reading increases incrementally from 0 up to a maximum counter reading. The additional period dT can then be defined by means of the computing unit 6 depending on the respective counter reading for the corresponding measurement cycle. By way of example, this allows the period (Ts+dT) to be increased for successive measurement cycles by increasing the additional period dT according to the respective counter reading.

By way of example, the counter used can be a software-based 4-bit counter or 5-bit counter. It goes without saying that other counter sizes are also possible. In the purely exemplary case of a 4-bit counter, the counter can therefore assume 16 counter readings of 0 to 15. For a given counter reading k, the additional period dT can therefore be defined as dT=(k/16*ΔTs), for example, wherein ΔTs corresponds to the maximum additional period. Alternatively, dT=([(n+1)/16]*ΔTs) can also be used as additional period, such that the additional period dT runs from ΔTs/16 to ΔTs.

If, by way of example, a number of 300 to 500 measurement cycles per measurement operation is taken as the starting point, in the case of a 4-bit counter, the value range of the counter will be run through multiple times during a measurement operation. The counter does not necessarily have be reset for the subsequent measurement operation.

The incremental variation of the period (Ts+dT) of the measurement cycles of a measurement operation, or else possibly a plurality of successive measurement operations, can prevent external interference with a more or less constant frequency of the order of magnitude 1/Ts having a significant influence on the accuracy of the capacitance measurement.

As described, in particular with respect to the figures, the improved concept therefore allows the capacitance of a capacitive element to be determined with greater reliability and in particular reduced influence from external interference. In this case, the corresponding measurement cycles are artificially extended. In principle, the extension can be undertaken in any state of the measuring arrangement or in any section of the measurement cycle. The transfer state is particularly suitable for avoiding current leakages. The extension could also take place during the charging state or the intermediate states, however. In various exemplary embodiments, the period of the measurement cycle can be continuously increased by an amount of a few percent, for example 1 to 3%. External interference therefore only has a fraction of the influence than would be the case without the improved concept. Erroneous touch recognition can be avoided as a result.

The invention claimed is:

1. A method for determining a capacitance of a capacitive element comprising:
   charging, during each measurement cycle of a plurality of successive measurement cycles, the capacitive element with a voltage source,
   transferring an amount of charge from the capacitive element to a further capacitive element;
   determining, following the plurality of measurement cycles and with an Analog to Digital Converter (ADC), a measured value relating to a total amount of charge transferred as a whole to the further capacitive element during the plurality of measurement cycles; and
   determining the capacitance of the capacitive element depending on the measured value,
   wherein, using a computing unit:
      a first period is defined for a first subset of the plurality of measurement cycles, and
      a second period is defined for a second subset of the plurality of measurement cycles, said second period differing from the first period;
   wherein:
      each of the measurement cycles contains a charging section, where the capacitive element is charged by the voltage source during the charging section, and
      each of the measurement cycles contains a transfer section, where the amount of charge is transferred from the capacitive element to the further capacitive element during the transfer section;
      each of the measurement cycles contains an intermediate section between the charging section and the transfer section, where the capacitive element is neither charged nor discharged during the intermediate section;
      a first intermediate duration is defined for the respective intermediate section of the measurement cycles of the first subset in order to define the first period and a second intermediate duration is defined for the respective intermediate section of the measurement cycles of the second subset in order to define the second period, and
      the second intermediate duration differs from the first intermediate duration.

2. The method as claimed in claim 1, wherein:
   a first charging duration is defined for the respective charging section of the measurement cycles of the first subset in order to define the first period and a second charging duration is defined for the respective charging section of the measurement cycles of the second subset in order to define the second period, wherein the second charging duration differs from the first charging duration; and/or
   a first transfer duration is defined for the respective transfer section of the measurement cycles of the first subset in order to define the first period and a second transfer duration is defined for the respective transfer section of the measurement cycles of the second subset in order to define the second period, wherein the second transfer duration differs from the first transfer duration.

3. The method as claimed in claim 1, wherein
each of the measurement cycles contains a further intermediate section upstream of the charging section or downstream of the transfer section, wherein the capacitive element is neither charged nor discharged during the further intermediate section.

4. The method as claimed in claim 3, wherein
a first further intermediate duration is defined for the respective further intermediate section of the measurement cycles of the first subset in order to define the first period and a second further intermediate duration is defined for the respective further intermediate section of the measurement cycles of the second subset in order to define the second period, wherein the second further intermediate duration differs from the first further intermediate duration.

5. The method as claimed in claim 1, wherein using the computing unit, a counter reading of a counter is set for each measurement cycle of the plurality of measurement cycles, and a period is defined for the respective measurement cycle depending on the respective set counter reading.

6. The method as claimed in claim 5, wherein
starting from an initial counter reading for each of the measurement cycles, the counter reading is increased by a predefined increment for as long as the counter reading is lower than or equal to a predefined maximum counter reading; and
the counter reading is reset to the initial counter reading if the counter reading has reached the maximum counter reading.

7. The method as claimed in claim 6, wherein the relationship N≤M applies, wherein M designates a number of measurement cycles of the plurality of measurement cycles, (N−1)*I is an integer that designates a difference between the maximum counter reading and the initial counter reading, and I designates the increment.

8. The method as claimed in claim 5, wherein using the computing unit, for each measurement cycle of the plurality of measurement cycles, the respective period is defined as the sum of a predefined minimum period that is constant for all the measurement cycles and an additional period that is dependent on the respective set counter reading.

9. The method as claimed in claim 8, wherein the minimum period is in a range between 1 μs and 20 μs.

10. The method as claimed in claim 8, wherein the respective additional period is shorter than or equal to a tenth of the minimum period.

11. A method for detecting a user input that includes a user touching a capacitive element, comprising:
a method for determining a capacitance of the capacitive element as claimed in claim 1 is carried out;
the determined capacitance of the capacitive element is compared with a predefined threshold value by means of the computing unit; and
the user input or the touching is detected by the computing unit depending on a result of the comparison.

12. A non-transitory computer readable medium program product having instructions, which, when executed by a computing unit of a measuring arrangement, cause the measuring arrangement to execute a method as claimed in claim 1.

13. A measuring arrangement for determining a capacitance of a capacitive element, the measuring arrangement comprising:
a connection to connect the capacitive element to the measuring arrangement;
a circuit that is configured, during each measurement cycle of a plurality of successive measurement cycles,
to connect the capacitive element to a voltage source in order to charge the capacitive element; and
to subsequently transfer an amount of charge from the capacitive element to a further capacitive element of the measuring arrangement; and
a computing unit that is configured, following the plurality of measurement cycles, to determine a measured value with an Analog to Digital Converter (ADC) relating to a total amount of charge transferred as a whole to the further capacitive element during the plurality of measurement cycles and to determine the capacitance of the capacitive element depending on the measured value,
wherein the computing unit is configured to:
define a first period for a first subset of the plurality of measurement cycles; and
define a second period for a second subset of the plurality of measurement cycles;
wherein:
each of the measurement cycles contains a charging section, where the capacitive element is charged by the voltage source during the charging section, and
each of the measurement cycles contains a transfer section, where the amount of charge is transferred from the capacitive element to the further capacitive element during the transfer section;
each of the measurement cycles contains an intermediate section between the charging section and the transfer section, where the capacitive element is neither charged nor discharged during the intermediate section;
a first intermediate duration is defined for the respective intermediate section of the measurement cycles of the first subset in order to define the first period and a second intermediate duration is defined for the respective intermediate section of the measurement cycles of the second subset in order to define the second period, and
the second intermediate duration differs from the first intermediate duration.

14. A user input device having a capacitive element that is arranged so as to be touched by a user, wherein the user input device contains a measuring arrangement for determining a capacitance of the capacitive element as claimed in claim 13.

* * * * *